United States Patent
Ikemoto et al.

(10) Patent No.: US 8,735,927 B2
(45) Date of Patent: May 27, 2014

(54) GROUP III NITRIDE SEMICONDUCTOR LIGHT-EMITTING DEVICE

(71) Applicant: Toyoda Gosei Co., Ltd., Kiyosu (JP)

(72) Inventors: Yuhei Ikemoto, Kiyosu (JP); Naoki Arazoe, Kiyosu (JP)

(73) Assignee: Toyoda Gosei Co., Ltd., Kiyosu-Shi, Aichi-Ken ( * ) Notice: Subject to any disclaimer, the term of this patent is extended or adjusted under 35 U.S.C. 154(b) by 0 days.

(21) Appl. No.: 13/725,677

(22) Filed: Dec. 21, 2012

(65) Prior Publication Data

US 2013/0161676 A1   Jun. 27, 2013

(30) Foreign Application Priority Data

Dec. 26, 2011 (JP) ................. 2011-282736

(51) Int. Cl.
*H01L 29/22* (2006.01)

(52) U.S. Cl.
USPC ........ 257/98; 257/95; 257/103; 257/E33.008; 257/E33.023; 257/E33.067

(58) Field of Classification Search
USPC ............. 257/95, 98, 103, E33.008, E33.023, 257/E33.067
See application file for complete search history.

(56) References Cited

U.S. PATENT DOCUMENTS

| 8,071,992 | B2* | 12/2011 | Kitano et al. | 257/98 |
| 2001/0021446 | A1* | 9/2001 | Takematsu et al. | 428/220 |
| 2002/0054258 | A1* | 5/2002 | Kondo et al. | 349/113 |
| 2008/0035953 | A1 | 2/2008 | Beom et al. | |
| 2012/0032217 | A1* | 2/2012 | Yen | 257/98 |

FOREIGN PATENT DOCUMENTS

JP   2008-047861 A1   2/2008

* cited by examiner

*Primary Examiner* — Andy Huynh
(74) *Attorney, Agent, or Firm* — McGinn IP Law Group, PLLC

(57) ABSTRACT

The invention provides a Group III nitride semiconductor light-emitting device which has a light extraction face at the n-layer side and which provides high light emission efficiency. The light-emitting device is produced through the laser lift-off technique. The surface of the n-GaN layer of the light-emitting device is roughened. On the n-GaN layer, a transparent film is formed. The transparent film satisfies the following relationship: $0.28 \leq n \times d1 \times 2/\lambda \leq 0.42$ or $0.63 \leq n \times d1 \times 2/\lambda \leq 0.77$, wherein n represents the refractive index of the transparent film, d1 represents the thickness of the transparent film in the direction orthogonal to an inclined face thereof, and $\lambda$ represents the wavelength of the light emitted from the MQW layer.

6 Claims, 5 Drawing Sheets

Film thickness d1 (nm)

n × d1 × 2 / λd

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device and, more particularly, to a Group III nitride semiconductor light-emitting device produced through the laser lift-off technique and providing high-intensity light emission.

2. Background Art

In the growth of Group III nitride semiconductors, a growth substrate made of sapphire is generally employed. Since sapphire is a non-conductive material, flow of current in the vertical direction is impaired. Also, sapphire has low thermal conductivity, which may inhibit radiation of heat generated in a semiconductor device disposed thereon. Difficulty is also encountered in processing of a sapphire substrate, such as dicing, since sapphire has no clear cleavage plane.

The aforementioned laser lift-off technique was developed in order to overcome these drawbacks. In laser lift-off, a Group III nitride semiconductor is grown on a growth substrate, and the interface between the growth substrate and the Group III nitride semiconductor is irradiated with a laser beam, to thereby decompose a part of the Group III nitride semiconductor, whereby the growth substrate is removed from the semiconductor.

Meanwhile, efforts have been made toward the development of techniques for further enhancing light extraction efficiency of such light-emitting devices. For example, Patent Document 1 discloses a GaN-based light emitting device which includes a first uneven structure 160a having a regulated repetition pattern and disposed on the n-GaN layer, and a second uneven structure 160b having an unregulated repetition pattern and disposed on the first uneven structure (see paragraph [0033] and FIG. 3 of Patent Document 1). Such a GaN-based light-emitting device is thought to provide high emission efficiency.

Patent Document 1: Japanese Patent Application Laid-Open (kokai) No. 2008-47861

Patent Document 1 also discloses that a transparent conductive layer 180 may be formed on the first and second uneven structures 160a, 160b (see paragraph [0039] and FIG. 6 of Patent Document 1). However, the transparent conductive layer 180 may impair the light extraction efficiency from the light extraction face.

SUMMARY OF THE INVENTION

The present invention has been conceived in order to solve the aforementioned technical problems. Thus, an object of the present invention is to provide a Group III nitride semiconductor light-emitting device having a light extraction face on an n-type semiconductor layer (hereinafter may be referred to as "n-layer") side, which device provides high light emission efficiency.

In a first aspect of the present invention for attaining the above object, there is provided a Group III nitride semiconductor light-emitting device, having a light-emitting layer formed of a Group III nitride semiconductor, a roughened n-layer, an n-electrode, and a transparent film which covers at least a part of the roughened face of the p-layer, wherein the transparent film satisfies the following relationship:

$$0.28 \leq n \times d \times 2/\lambda \leq 0.42 \text{ or } 0.63 \leq n \times d \times 2/\lambda \leq 0.77,$$

wherein n represents the refractive index of the transparent film, d represents the thickness of the transparent film in the direction orthogonal to an inclined face thereof, and λ represents the wavelength of the light emitted from the light-emitting layer.

The Group III nitride semiconductor light-emitting device exhibits high light extraction efficiency, since the n-layer has been roughened. In addition, the transparent film formed on the n-layer further multiplies the light emission, leading to enhanced light extraction efficiency.

A second aspect of the present invention is directed to a specific embodiment of the Group III nitride semiconductor light-emitting device of the first aspect, wherein the transparent film is a conductive transparent film formed of any of ITO, ICO, IZO, ZnO, $TiO_2$, $NbTiO_2$, and $TaTiO_2$. When a conductive transparent film is formed of such a material, diffusion of current can be attained in the plane direction of the light-emitting layer, without substantially decreasing light extraction efficiency.

A third aspect of the present invention is directed to a specific embodiment of the Group III nitride semiconductor light-emitting device of the first aspect, wherein the transparent film is a protective film formed of a dielectric material. In this case, the protective film can be formed, while high light extraction efficiency is maintained.

A fourth aspect of the present invention is directed to a specific embodiment of the Group III nitride semiconductor light-emitting device of any of the first to third aspects, wherein the roughened face of the n-layer is formed through epitaxial growth of the n-layer on a growth substrate, removing the growth substrate from the n-layer, and roughening the surface of the n-layer from which the growth substrate has been removed. Since the face exposed after removal of the growth substrate has an uppermost surface substantially consisting of nitrogen atoms, the face can be easily roughened through etching.

According to the present invention, a light-emitting device having a light extraction face on the n-layer side, the device providing high light emission efficiency, is provided.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
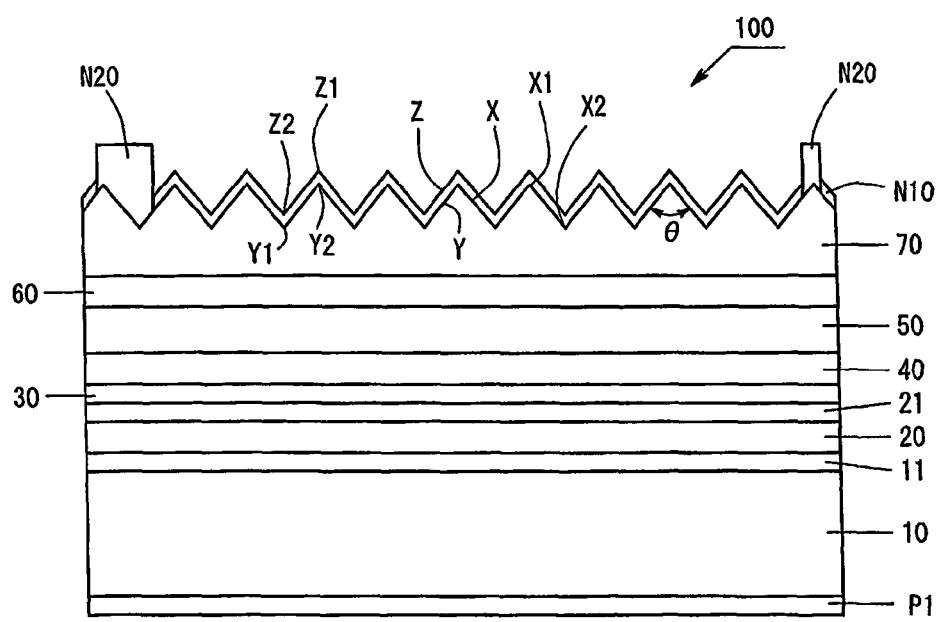
FIG. 1 is a schematic diagram of a Group III nitride semiconductor light-emitting device according to an embodiment.

Specific embodiments of the light-emitting device of the present invention will now be described, with reference to the drawings. However, the present invention is not limited to these embodiments. Layer structures of layers of the light-emitting device and electrode structures thereof are given as exemplary structures. In the drawings, roughened sites are shown in an exaggerated manner. Needless to say, layer structures other than those of the embodiments may also be employed. In the drawings, thickness of each layer is not an actually measured one but a conceptual thickness.

1. Semiconductor Light-Emitting Device

An embodiment of a Group III nitride semiconductor light-emitting device will now be described. FIG. 1 is a schematic layer structure (cross-section) of a light-emitting device 100. The light-emitting device 100 is a semiconductor device formed of a Group III nitride semiconductor and has been produced through the laser lift-off technique in which a growth substrate is removed by a laser beam. Thus, a growth substrate such as a sapphire substrate has been separated from the light-emitting device 100 and is not shown in FIG. 1. A light extraction face Z is present on the n-layer side.

As shown in FIG. 1, the light-emitting device 100 is formed of a p-electrode P1, a support substrate 10, a first conductive metal layer 11, a conductive joining material layer 20, a second conductive metal layer 21, a conductive reflective film 30, a p-GaN layer 40, a GaN layer 50, an MQW layer 60 serving as a light emission source, an n-GaN layer 70, a transparent film N10, and an n-pad electrode N20, deposited in this order.

The p-electrode P1 is formed of a Pt layer, a Ti layer, a Pt layer, a Ti layer, and an Au layer, which are deposited on the support substrate 10 in this order.

The support substrate 10 maintains the shape of the light-emitting device 100, prevents deformation of the light-emitting device 100, and enhances the mechanical strength of the light-emitting device 100. The support substrate 10 is made of Si, but it may be made of GaAs, Ge, or another metallic material. After fabrication of the light-emitting device 100, current must be caused to flow in the light-emitting layer. Thus, the support substrate 10 must be made of a conductive material.

The first conductive metal layer 11 enhances adhesion between the support substrate 10 and the conductive joining material layer 20. The first conductive metal layer 11 is made of a material such as Au.

The conductive joining material layer 20 is disposed so as to join the semiconductor layers formed in the production of the light-emitting device 100 to the support substrate 10. After fabrication of the light-emitting device 100, current must be caused to flow in the light-emitting layer. Thus, the conductive joining material layer 20 may be made of a conductive material such as an AuSn-based solder. However, the conductive joining material layer 20 may be made of another material.

The second conductive metal layer 21 enhances adhesion between the conductive joining material layer 20 and the conductive reflective film 30. The second conductive metal layer 21 prevents diffusion of the solder material into the conductive joining material layer 20. The second conductive metal layer 21 is made of a material such as Au.

The conductive reflective film 30 reflects the light emitted by the MQW layer 60. The conductive reflective film 30 must have electrical conductivity so as to ensure sufficient current flow in the MQW layer 60 of the light-emitting device 100. Thus, the conductive reflective film 30 has both light reflectivity and electrical conductivity.

The conductive reflective film 30 is made of a material, such as Ag, Al, or an alloy containing Al or Ag as a base. The material may also be rhodium (Rh), ruthenium (Ru), platinum (Pt), palladium (Pd), or an alloy containing at least one of these metals. Alternatively, the reflective film may be a distributed Bragg reflective film (DBR) formed of two layers made from materials having different refractive indexes.

The p-GaN layer 40 confines electrons therein. That is, the p-GaN layer 40 prevents electrons from diffusing to the conductive reflective film 30, whereby the light emission efficiency of the MQW layer 60 can be enhanced.

The GaN layer 50 is a non-doped GaN layer. Alternatively, it may be a p-GaN layer.

The MQW layer 60 serves as a light-emitting layer based on the mechanism of recombination of electrons and holes. Thus, the MQW layer 60 has a multiple quantum well structure in which well layers having a small band gap and barrier layers having a large band gap are alternatingly deposited. In this embodiment, the well layers are formed of InGaN, and the barrier layers are formed of AlGaN. Alternatively, the well layers may be formed of GaN, and the barrier layers formed of AlGaN. Yet alternatively, the barrier layers may be formed of AlInGaN. These layers may be combined without any limitations to form a unit structure having layers, and the unit structures may be repeatedly deposited. The light-emitting layer may be an SQW layer.

The n-GaN layer 70 serves as a contact layer which is in contact with the n-pad electrode N20 and prevents application of stress to the MQW layer 60 as well as diffusion of In contained in the MQW layer 60. The n-GaN layer 70 has an Si concentration of $1 \times 10^{18}/cm^3$ or higher. Although the n-GaN layer 70 is employed in this embodiment, an n-layer made of another material may also be used.

The light extraction face Z of the n-GaN layer 70 has been roughened. That is, as shown in FIG. 1, the n-GaN layer 70 has an uneven surface X, whereby the light extraction efficiency of the semiconductor layer is enhanced. Note that, in FIG. 1, the uneven shapes of the n-GaN layer 70 and the transparent film N10 are shown in an exaggerated manner for the sake of easy understanding.

Needless to say, the transparent film N10 is made of a transparent material, since the light emitted by the MQW layer 60 is efficiently extracted. The transparent film N10 is made of $SiO_2$. The material $SiO_2$ protects the surface of the light-emitting device 100. The shape and thickness of the transparent film N10 will be described in detail hereinbelow.

Figure 2:
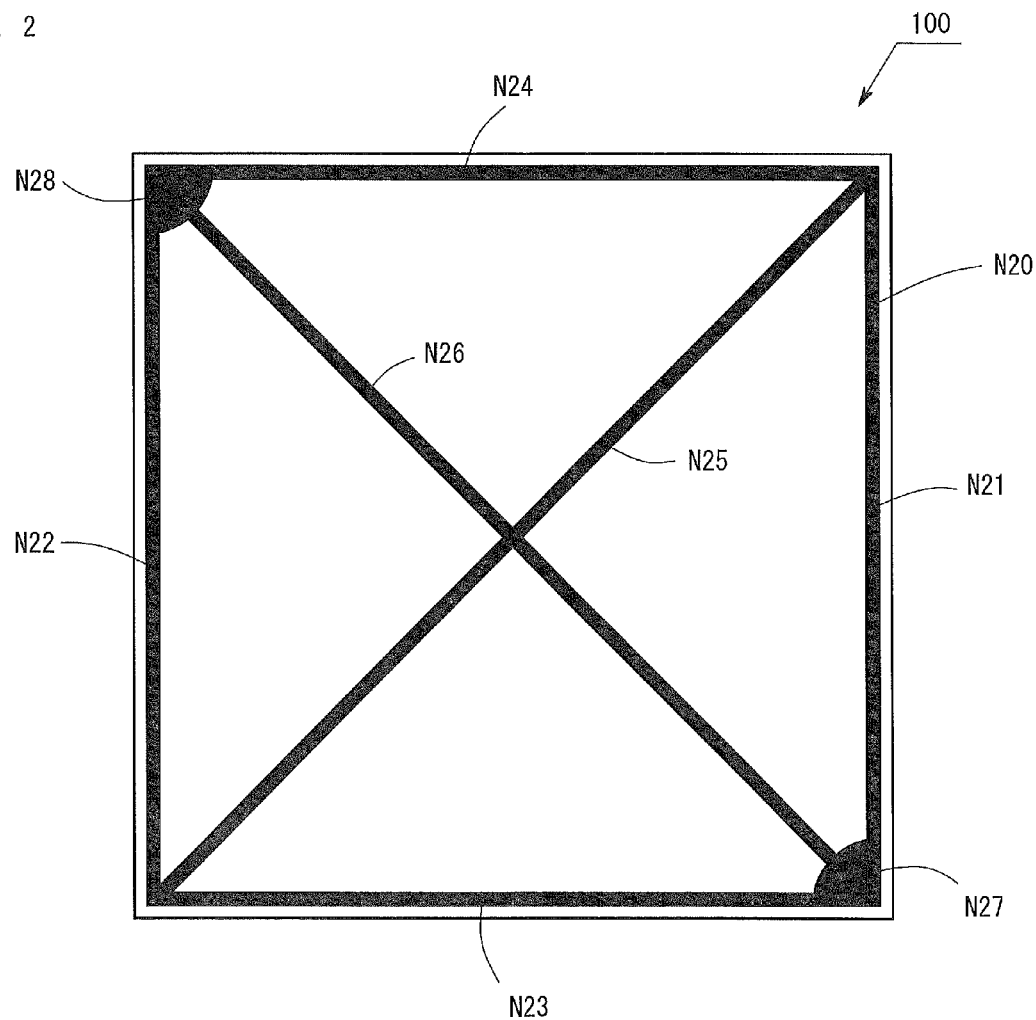
FIG. 2 is a plan view of the n-pad electrode of the Group III nitride semiconductor light-emitting device according to the embodiment.

The n-pad electrode N20 is disposed on the n-GaN layer 70. In other words, electrical conduction is established between the n-pad electrode N20 and the n-GaN layer 70. The n-pad electrode N20 is a metallic electrode, which is non-transparent. FIG. 2 is a plan view of the light-emitting device 100, as viewed from the top of the drawing of FIG. 1. As shown in FIG. 2, the n-pad electrode N20 is disposed so as to avoid, to a maximum extent, interception of the light emitted by the light-emitting layer.

Specifically, the n-pad electrode N20 includes frame portions N21, N22, N23, N24, N25, and N26, and pad portions N27 and N28. The frame portions N21, N22, N23, and N24 are disposed so as to enclose the light extraction face. The frame portions N25 and N26 are disposed so as to cross the light extraction face. The pad portion N27 is disposed at the corner formed between the frame portions N21 and N23, and the pad portion N28 is disposed at the corner formed between the frame portions N22 and N24.

2. Transparent Film 2-1. Morphology of Transparent Film

As mentioned above, the transparent film N10 is disposed on the roughened n-GaN layer 70 and covers the upper surface of the n-GaN layer 70, excluding the area corresponding to the n-pad electrode N20. Alternatively, the transparent film may cover at least a part of the roughened uneven surface X of the n-GaN layer 70.

The uneven surface X of the n-GaN layer 70 has a shape of a hexagonal pyramid. The uneven surface X has a top X1 and a bottom X2. In the uneven surface X, the bottoms of the hexagonal pyramids are repeatedly arranged. The top X1 of the uneven surface X is at the highest (the most distal) position from the p-electrode P1. The top X1 is a position protruded toward the transparent film N10. The bottom X2 of the uneven surface X is at the lowest (the most proximal) position from the p-electrode P1. The bottom X2 is a position dented with respect to the transparent film N10.

The distance between the top X1 and the bottom X2 is 1,500 nm to 2,500 nm. As shown in FIG. 1, the angle at the top X1 formed between the two faces of a hexagonal pyramid θ is about 60°. The angle at the bottom X2 formed between the two faces of a hexagonal pyramid θ is about 60°.

The shape of the transparent film N10 is similar to that of the uneven shape of the n-GaN layer 70. That is, the light extraction face of the Z of the transparent film N10 assumes an uneven surface formed of hexagonal pyramids. More specifically, in the transparent film, the bottoms of the hexagonal pyramids are repeatedly arranged. The top Z1 of the light extraction face Z is at the highest (the most distal) position from the p-electrode P1. The top Z1 is a position protruded toward the outside of the light-emitting device 100. The bottom Z2 of the light extraction face Z is at the lowest (the most proximal) position from the p-electrode P1. The bottom Z2 is a position dented with respect to the outside of the light-emitting device 100.

Meanwhile, the shape of a face Y of the transparent film N10 on the semiconductor layer side; i.e., the face Y on the n-GaN layer 70 side, corresponds to the uneven surface X of the n-GaN layer 70. That is, the face Y of the transparent film N10 assumes an uneven surface formed of hexagonal pyramids. More specifically, in the transparent film, the bottoms of the hexagonal pyramids are repeatedly arranged. The top Y1 of the face Y is at the highest (the most distal) position from the p-electrode P1. The top Y1 is a position protruded toward the n-GaN layer 70. The bottom Y2 of the face Y is at the lowest (the most proximal) position from the p-electrode P1. The bottom Y2 is a position dented with respect to the n-GaN layer 70. The top Y1 of the face Y is located so as to face the bottom X2 of the uneven surface X. The bottom Y2 of the face Y is located so as to face the top X1 of the uneven surface X.

The shape of the light extraction face Z corresponds to the uneven shape of the face Y. Specifically, the top Z1 of the light extraction face Z is located on the opposite side (backside) of the bottom Y2 of the face Y. The bottom Z2 of the light extraction face Z is located on the opposite side (backside) of the top Y1 of the face Y.

Thus, in the transparent film N10, the top Z1 faces opposite the bottom Y2, and the bottom Z2 faces opposite the top Y1.

Next, the positional relationship between the uneven surface X of the n-GaN layer 70 and the light extraction face Z of the same will be described. In FIG. 1, the top Z1 of the light extraction face Z is located above the top X1 of the uneven surface X; i.e., at a position along the c-axis imaginarily extending from the top X1 of the uneven surface X. Also, in FIG. 1, the bottom Z2 of the light extraction face Z is located above the bottom X2 of the uneven surface X; i.e., at a position along the c-axis imaginarily extending from the bottom X2 of the uneven surface X.

2-2. Thickness of Transparent Film

Figure 3:
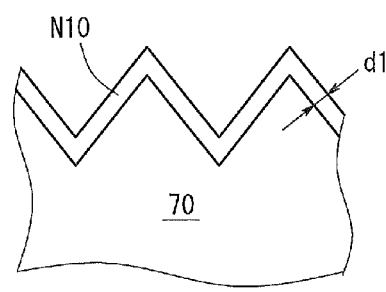
FIG. 3 is a schematic diagram of the transparent film of the Group III nitride semiconductor light-emitting device according to the embodiment, showing the thickness of the film.

FIG. 3 is an enlarged view of a part of the transparent film N10 shown in FIG. 1. In FIG. 3, the thickness (d1) of the transparent film N10 is indicated. The thickness d1 refers to the thickness of the transparent film N10 in the direction orthogonal to an inclined face of the uneven surface X of the n-GaN layer 70.

The thickness d of the transparent film N10 is adjusted so as to satisfy the following relationship:

$$0.28 \leq n \times d \times 2/\lambda \leq 0.42 \quad (1)$$ or $$0.63 \leq n \times d \times 2/\lambda \leq 0.77 \quad (2),$$

wherein n represents the refractive index of the transparent film, d represents the thickness of the transparent film in the direction orthogonal to an inclined face thereof, and λ represents the wavelength of the light emitted from the light-emitting layer. The thickness of the transparent film N10 is not the film thickness in the c-axis direction, but the film thickness from the uneven surface X of the n-GaN layer 70, as shown in FIG. 3. That is, the film thickness is the thickness of the transparent film in the direction orthogonal to the uneven surface X (an inclined face). The film thickness d is equivalent to an optical path length when incidence of light occurs at such an angle that the optical path from the uneven surface X to the light extraction face Z becomes minimum.

In this embodiment, the light emitted by the MQW layer 60 was found to have a wavelength of 452.5 nm. The refractive index of the transparent film N10 (i.e., that of $SiO_2$) is 1.45. In this case, the thickness d of the transparent film N10 satisfying the inequality (1) is 43.7 nm to 65.5 nm. The thickness d of the transparent film N10 satisfying the inequality (2) is 98.3 nm to 120.1 nm.

As described in the experiment section hereinbelow, when the thickness of the transparent film N10 is adjusted so as to fall within the range, the intensity of the light emitted by the light-emitting device 100 is high. In other words, when the wavelength of the light emitted by the light-emitting layer is constant, the high light extraction efficiency of the light-emitting device 100 can be attained by producing the device while modifying the thickness of the transparent film N10 depending on the refractive index of the employed material.

3. Method for Producing Semiconductor Light-Emitting Device

In the semiconductor device production method according to the present embodiment, the aforementioned respective layers are grown through metal-organic chemical vapor deposition (MOCVD). The steps of the method will next be described.

The carrier gas employed in the method is hydrogen ($H_2$), nitrogen ($N_2$), or a gas mixture of hydrogen and nitrogen ($H_2+N_2$). Ammonia gas ($NH_3$) was employed as a nitrogen source. Trimethylgallium ($Ga(CH_3)_3$, hereinafter may be referred to as "TMG") was employed as a Ga source. Trimethylindium ($In(CH_3)_3$, hereinafter may be referred to as "TMI") was employed as an In source. Trimethylaluminum ($Al(CH_3)_3$, hereinafter may be referred to as "TMA") was employed as an Al source. Silane ($SiH_4$) was employed as an n-type dopant gas. Cyclopentadienylmagnesium ($Mg(C_5H_5)_2$, hereinafter may be referred to as "$Cp_2Mg$") was employed as a p-type dopant gas.

3-1. Step of Depositing Layers

In the present embodiment, a c-plane sapphire substrate S1 was provided, and the sapphire substrate S1 was placed in an MOCVD furnace. Subsequently, the sapphire substrate S1 was subjected to cleaning in a hydrogen gas atmosphere, to thereby remove deposits from the surface of the sapphire substrate S1. Then, a low-temperature buffer layer B1 was formed on the sapphire substrate S1.

Subsequently, the n-GaN layer 70 was grown on the low-temperature buffer layer B1 in the +c-axis direction of GaN. Then, the MQW layer 60 was formed on the n-GaN layer 70. The GaN layer 50 was formed on the MQW layer 60. The p-GaN layer 40 was formed on the GaN layer 50. Then, the conductive reflective film 30 was formed on the p-GaN layer 40.

3-2. Step of Forming Joining Layer

Figure 4:
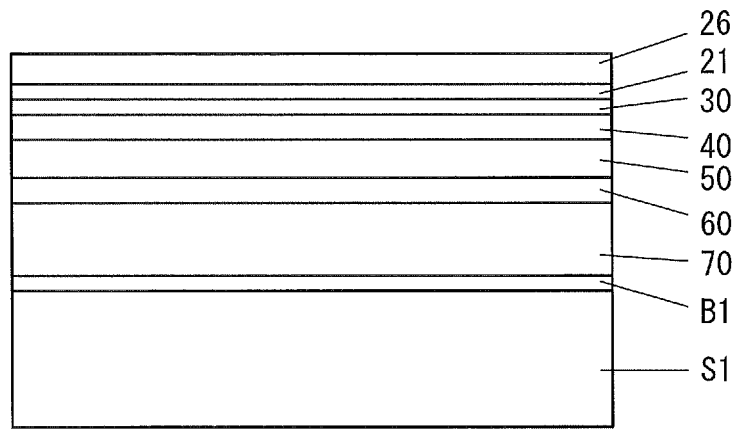
FIG. 4 is a diagram illustrating a method of producing the Group III nitride semiconductor light-emitting device according to the embodiment (part 1)
Figure 5:
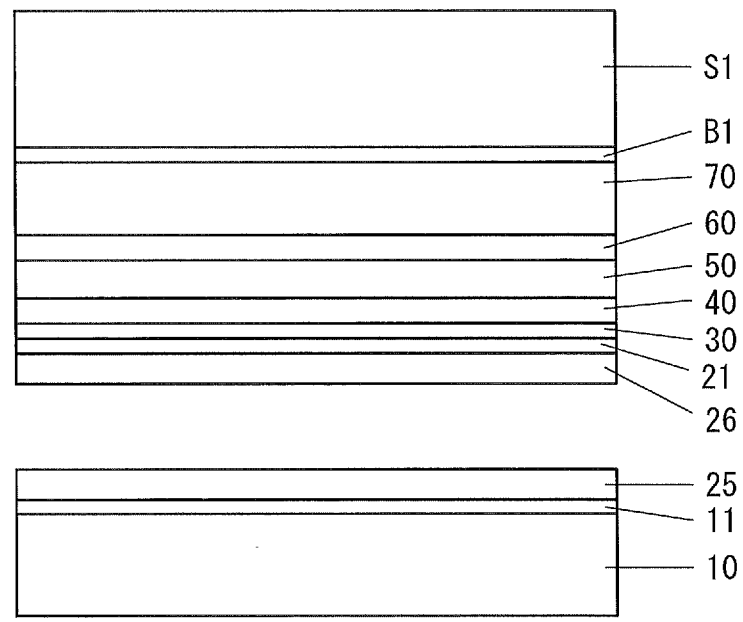
FIG. 5 is a diagram illustrating the method of producing the Group III nitride semiconductor light-emitting device according to the embodiment (part 2)

On the conductive reflective film 30, the second conductive metal layer 21 and the low-melting-metal layer 26 were formed, to thereby produce a deposited structure shown in FIG. 4. Separately, as shown in FIG. 5, the first conductive metal layer 11 and the low-melting-metal layer 25 were formed on the support substrate 10. Then, as shown in FIG. 5, the low-melting-metal layer 25 formed on the support substrate 10 was caused to face the low-melting-metal layer 26 formed on the conductive reflective film 30 on the sapphire substrate S1 side. The low-melting-metal layer 25 and the low-melting-metal layer 26 were joined to each other, to thereby form the conductive joining layer 20 in which the low-melting-metal layers 25, 26 were integrated. Thus, a deposited structure shown in FIG. 6 was produced.

3-3. Step of Removing Growth Substrate

Figure 6:
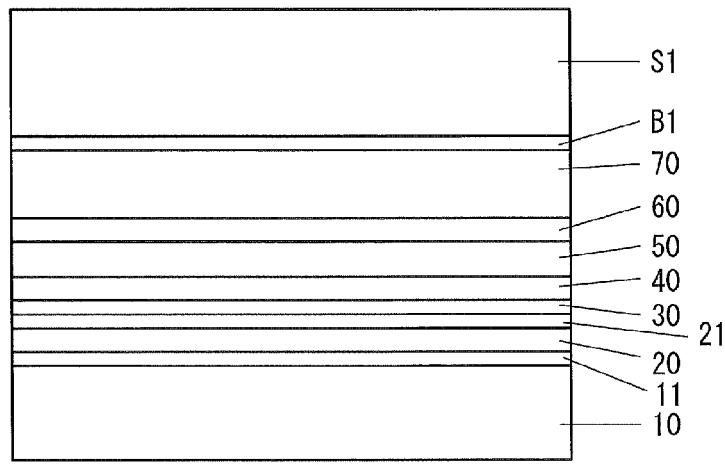
FIG. 6 is a diagram illustrating the method of producing the Group III nitride semiconductor light-emitting device according to the embodiment (part 3)

The joint interface between the deposited structure shown in FIG. 6 and the sapphire substrate S1 was irradiated with a laser beam. The laser beam employed was KrF high-power pulse laser beam having a wavelength of 248 nm. Alternatively, any of other laser beams such as YAG laser beams (355 nm, 266 nm), XeCl laser beam (308 nm), and ArF laser beam (155 nm) may be employed, so long as they have a wavelength shorter than 365 nm.

Figure 7:
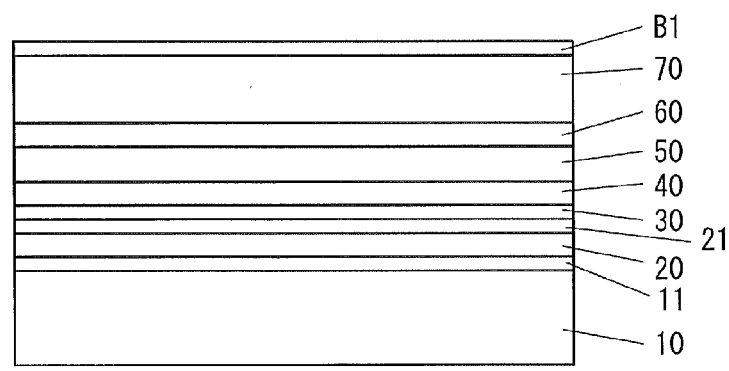
FIG. 7 is a diagram illustrating the method of producing the Group III nitride semiconductor light-emitting device according to the embodiment (part 4)

As shown in FIG. 7, the sapphire substrate S1 was removed from the deposited structure. Meanwhile, the low-temperature buffer layer B1 is thin. Therefore, at least a part of the low-temperature buffer layer B1 is also removed with the sapphire substrate S1 in the growth substrate removing step.

3-4. Surface Roughening Step

Figure 8:
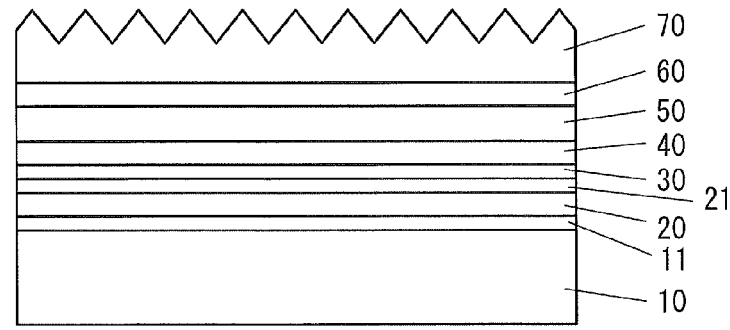
FIG. 8 is a diagram illustrating the method of producing the Group III nitride semiconductor light-emitting device according to the embodiment (part 5)

Subsequently, the low-temperature buffer layer B1 was removed, and the surface of the n-GaN layer 70 was roughened. The surface of the n-GaN layer 70 assumes a −c plane; i.e., a plane substantially consisting of nitrogen atoms. Thus, the n-GaN layer 70 was provided with an uneven surface X through etching. Specifically, the surface of the n-GaN layer 70 was immersed in TMAH solution. The TMAH solution was heated to 60° C. The −c plane can be etched by use of TMAH solution. Through etching of the −c plane, the uneven surface X was etched to have a hexagonal pyramid pattern. The hexagonal pyramid pattern of the uneven surface X has slight irregularity in shape, caused by variation in conditions (degree of immersion in TMAH solution) or other factors. Instead of TMAH solution, aqueous potassium hydroxide (aq. KOH) may also be used. FIG. 8 schematically shows the deposited structure after surface roughening. Thus, the roughened uneven surface X is formed through epitaxial growth of the n-layer on the sapphire growth substrate S1, removing the sapphire growth substrate S1 from the n-layer, and roughening the surface of the n-layer from which the sapphire growth substrate S1 has been removed.

3-5. Step of Forming Transparent Film

On the roughened n-GaN layer 70, the transparent film N10 was formed. Specifically, $SiO_2$ film was formed on the entire uneven surface X of the n-GaN layer 70 by means of a sputtering apparatus.

3-6. Step of Forming Electrodes

On the surface of the support substrate 10 opposite the conductive joining layer 20, the p-electrode P1 was formed. The p-electrode P1 was formed of a Pt layer, a Ti, a Pt, a Ti layer, and an Au layer which were deposited in this order on the support substrate 10. On the n-GaN layer 70, the n-pad electrode N20 was formed. The n-pad electrode N20 was formed of a W layer, a Ti layer, and an Au layer which were deposited in this order on the n-GaN layer 70. FIG. 2 shows the shape of the n-pad electrode N20. Through the aforementioned steps, the light-emitting device 100 shown in FIG. 1 was fabricated.

4. Results of Experiments

The performance of the light-emitting device 100 was tested, and the results will be described. In the following experiments, an $SiO_2$ film was used as the transparent film N10, and the intensity of the emitted light (Iv) was measured under variation of the thickness of the $SiO_2$ film.

Table 1 shows the change in emitted light intensity Iv when the thickness d1 of the $SiO_2$ transparent film N10 was varied. Iv was also measured when no transparent film N10 was provided. The film thickness d1 is equivalent to the film thickness d in the inequality (1) or (2).

Values of the thickness d1 of the transparent film N10 are shown in the first left column of Table 1. Since the transparent film N10 was formed on the roughened n-GaN layer 70, the thickness d1 of the uneven surface is smaller than the film thickness d0, which is a film thickness of the transparent film formed on a flat surface. In this case, the thickness d0 of the transparent film formed on the flat surface in a similar manner was about 2.3 times the film thickness d1.

Values of the optical path difference (n×d1×2) are shown in the second left column of Table 1. The refractive index n of the transparent film N10 is 1.45. Values of the ratio of optical path difference to wavelength (n×d1×2/λd) are shown in the third left column of Table 1. The λd represents the wavelength of the light emitted by the light-emitting layer (in air).

Table 1 shows the emitted light intensity Iv0 obtained in the case where no transparent film N10 has been formed, the emitted light intensity Iv1 obtained in the case where the transparent film N10 has been formed, and the ratio Iv1/Iv0. From these data, the film thickness which can maintain the light intensity even in the presence of the transparent film N10 was determined. The favorable condition corresponds to the case where the Iv ratio (Iv1/Iv0) is 0.95 or higher.

As shown in Table 1, when the transparent film N10 had a thickness d1 of 48 nm; i.e., when the n×d1×2/λd was 0.31, the Iv ratio was 0.97. When the transparent film N10 had a thickness d1 of 57 nm; i.e., when the n×d1×2/λd was 0.37, the Iv ratio was 0.96. When the transparent film N10 had a thickness d1 of 109 nm; i.e., when the n×d1×2/λd was 0.72, the Iv ratio was 0.96. In these cases, light intensity is thought to be multiplied.

TABLE 1

| Film thickness | Optical path difference | Optical path difference/ | Results | | |
|---|---|---|---|---|---|
| d1 (nm) | n × d1 × 2 (nm) | wavelength n × d1 × 2/λd | Iv0 No film | Iv1 Film | Iv ratio Iv1/Iv0 |
| 48 | 142.5 | 0.31 | 15.5 | 15.0 | 0.97 |
| 57 | 168.4 | 0.37 | 16.0 | 15.4 | 0.96 |
| 65 | 194.3 | 0.43 | 15.8 | 14.8 | 0.94 |
| 87 | 259.1 | 0.57 | 16.4 | 15.4 | 0.94 |
| 109 | 323.9 | 0.72 | 16.4 | 15.7 | 0.96 |
| 130 | 388.7 | 0.86 | 15.5 | 14.5 | 0.94 |
| 152 | 453.5 | 1.00 | 13.8 | 12.6 | 0.91 |
| 178 | 529.9 | 1.17 | 16.8 | 15.8 | 0.94 |
| 239 | 712.6 | 1.57 | 14.0 | 13.2 | 0.94 |

Figure 9:
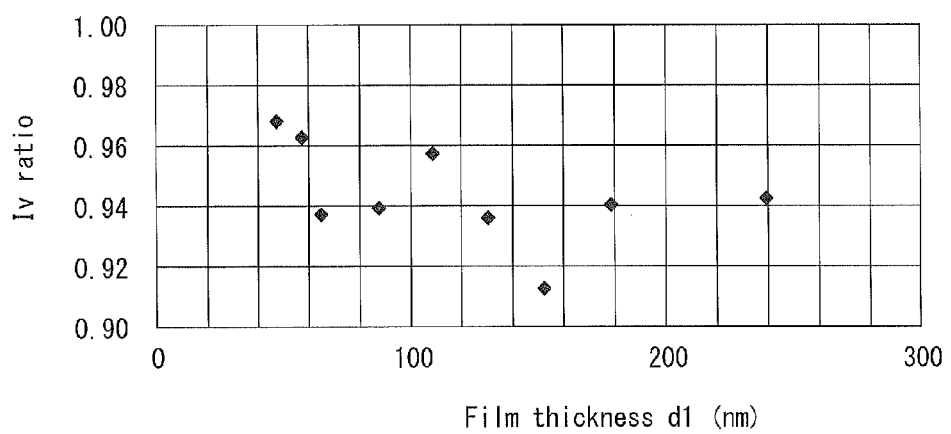
FIG. 9 is a graph showing the relationship between the relative light output and the thickness of the transparent film of the Group III nitride semiconductor light-emitting device according to the embodiment (part 1)

FIG. 9 is a graph showing the result of the experiment. In FIG. 9, the horizontal axis represents the film thickness d1 of the micro-processed face, and the vertical axis represents the Iv ratio. As shown in FIG. 9, the Iv ratio slightly increased in a specific range of film thickness d1, and slightly decreased in another range of film thickness d1.

Figure 10:
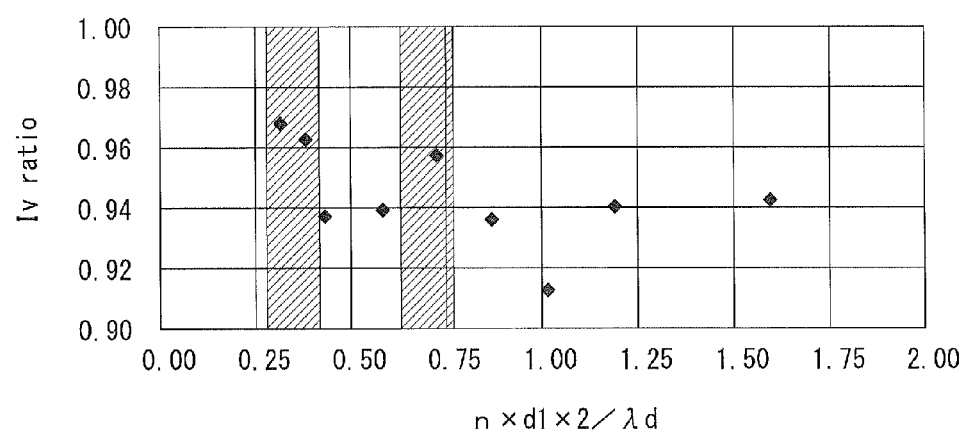
FIG. 10 is a graph showing the relationship between the relative light output and the thickness of the transparent film of the Group III nitride semiconductor light-emitting device according to the embodiment (part 2).

FIG. 10 is a similar graph to the graph of FIG. 9, except that the horizontal axis has been changed. In FIG. 10, the horizontal axis represents the n×d1×2/λd, and the vertical axis represents the Iv ratio. As described above, the refractive index n of the transparent film N10 (i.e., that of $SiO_2$) was 1.45. The wavelength of the light emitted by the light-emitting layer (λd) was 452.5 nm. That is, the refractive index n of the transparent film N10 and the wavelength of the light emitted by the light-emitting layer (λd) are constant. Therefore, the n×d1×2/λd is a product film thickness d1 and a constant (2×n/λd).

As shown in FIG. 10, the Iv ratio is preferably 0.95 or higher (i.e., falling within regions hatched by slashes in FIG. 10). The regions correspond to those represented by the aforementioned inequalities (1) and (2).

When the equation $n^2 = n1 \times n2$, wherein n1 represents the refractive index of the n-GaN layer 70, and n2 represents the refractive index of air, is established, the light extraction efficiency is the highest. In the experiment, n is 1.45, n1 is 2.6, and n2 is 1. Since the n2 is about 2.1, the light extraction efficiency is thought to be high.

5. Variations 5-1. Transparent Film

In the above embodiment, the transparent film N10 was formed of $SiO_2$, which is a dielectric material. Other than $SiO_2$, the transparent film N10 may be formed of $Si_3N_4$ or $SiO_{2X}N_{4Y}$ (X+3Y=1).

5-2. Conductive Transparent Film

The transparent film N10 is preferably formed from a conductive material. In this case, diffusion of current can be realized in the plane direction of the semiconductor layer (lateral direction in FIG. 1), whereby efficient current flow can be attained over the entire light emission area of the light-emitting layer. Since the transparent film N10 is electrically conductive, the n-pad electrode N20 is preferably formed on the transparent film N10. In this case, the maximum possible region of the uneven surface X of the n-GaN layer 70 is covered with the pad electrode, whereby current flow can be attained in the plane direction of the MQW layer 60.

As described above, even when a conductive transparent film is provided, the thickness of the film is tuned so as to satisfy the inequality (1) or (2). Although the refractive index varies depending on the material, the transparent film N10 is formed at such a thickness that high light extraction efficiency can be attained. The conductive transparent film may also be formed of ITO, ICO, IZO, ZnO, $TiO_2$, $NbTiO_2$, or $TaTiO_2$.

6. Summary of the Embodiment

As specifically described above, the growth substrate has been removed from the light-emitting device 100 of the present embodiment through the laser lift-off technique. The semiconductor layer on the n-layer side from which the growth substrate has been removed is roughened. Therefore, the efficiency of extraction of light from the semiconductor layer is high. The transparent film N10 is formed on the roughened semiconductor layer.

The transparent film N10 has an uneven shape on its roughened semiconductor layer side, the shape corresponding to that of the roughened semiconductor layer. Also, the transparent film N10 has an uneven shape on its light extraction face side, the shape corresponding to that of the roughened semiconductor layer. Through employment of the light-emitting device having this structural feature, the light extraction efficiency can be enhanced, and efficient current diffusion in the plane direction can be attained. The thickness of the transparent film N10 is adjusted so that an optical path difference multiplies the light intensity. Through this optical characteristic, the light-emitting device exhibits excellent light emission performance.

The above embodiment is intended to illustrate the invention and should not be construed as limiting the present invention thereto. Thus, it is understood various modifications and variations will be apparent those skilled in the art, without departing from the spirit of the present invention. The depositing mode of the deposited structure is not limited to that shown in the drawings. The number of repetition of the deposited structures and component layers may be determined without limitation. Other than metal-organic chemical vapor deposition (MOCVD), other vapor deposition methods may be employed, so long as crystals are grown from carried gases.

What is claimed is:

1. A Group III nitride semiconductor light-emitting device, comprising:
   a light-emitting layer formed of a Group III nitride semiconductor;
   a roughened n-type semiconductor layer is formed on the light-emitting layer;
   an n-electrode is formed on the n-type semiconductor layer;
   and a transparent film which covers at least a part of a roughened face of the n-type semiconductor layer, wherein the transparent film satisfies following relationship:

$$0.28 \leq n \times d \times 2/\lambda \leq 0.42 \text{ or } 0.63 \leq n \times d \times 2/\lambda \leq 0.77,$$

wherein n represents a refractive index of the transparent film, d represents a thickness of the transparent film in a direction orthogonal to an inclined face thereof, and λ represents a wavelength of light emitted from the light-emitting layer.

2. The Group III nitride semiconductor light-emitting device according to claim 1, wherein the transparent film is a conductive transparent film formed of any of ITO, ICO, IZO, ZnO, $TiO_2$, $NbTiO_2$, and $TaTiO_2$.

3. The Group III nitride semiconductor light-emitting device according to claim 1, wherein the transparent film is a protective film formed of a dielectric material.

4. The Group III nitride semiconductor light-emitting device according to claim 1, wherein the roughened face of the n-type semiconductor layer is formed through epitaxial growth of the n-type semiconductor layer on a growth substrate, removing the growth substrate from the n-type semiconductor layer, and roughening a surface of the n-type semiconductor layer from which the growth substrate has been removed.

5. The Group III nitride semiconductor light-emitting device according to claim 2, wherein the roughened face of the n-type semiconductor layer is formed through epitaxial growth of the n-type semiconductor layer on a growth substrate, removing the growth substrate from the n-type semiconductor layer, and roughening a surface of the n-type semiconductor layer from which the growth substrate has been removed.

6. The Group III nitride semiconductor light-emitting device according to claim 3, wherein the roughened face of the n-type semiconductor layer is formed through epitaxial growth of the n-type semiconductor layer on a growth substrate, removing the growth substrate from the n-type semiconductor layer, and roughening a surface of the n-type semiconductor layer from which the growth substrate has been removed.

* * * * *